(12) United States Patent
Brcka (10) Patent No.: US 6,446,572 B1
(45) Date of Patent: Sep. 10, 2002

(54) EMBEDDED PLASMA SOURCE FOR PLASMA DENSITY IMPROVEMENT

(75) Inventor: Jozef Brcka, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 17 days.

(21) Appl. No.: 09/642,446

(22) Filed: Aug. 18, 2000

(51) Int. Cl.$^7$ ........................................... C23C 16/507
(52) U.S. Cl. ........................ 118/723 ER; 118/723 E; 118/723 IR; 118/723 AN
(58) Field of Search ................. 156/345; 204/192.15, 204/298.03, 298.11, 298.15, 298.2, 298.41, 192.12, 192.13, 192.18, 192.32, 192.38, 298.04, 298.06, 298.007; 118/723 I, 723 E, 715, 719, 723 MW, 723 MP, 723 AN, 718, 723 MR, 723 VE; 219/121.43; 438/710; 216/68

(56) References Cited

U.S. PATENT DOCUMENTS

| | | | |
|---|---|---|---|
| 4,792,378 A | * 12/1988 | Rose et al. ................... 438/706 |
| 4,948,458 A | 8/1990 | Ogle ........................... 156/643 |
| 4,981,722 A | * 1/1991 | Moller et al. .............. 427/248.1 |
| 5,399,254 A | * 3/1995 | Geisler et al. ........... 204/298.31 |
| 5,449,432 A | 9/1995 | Hanawa ...................... 15/643.1 |
| 5,468,296 A | 11/1995 | Patrick et al. .............. 118/723 |
| 5,522,934 A | * 6/1996 | Suzuki et al. ......... 118/723 AN |
| 5,597,438 A | 1/1997 | Grewal et al. .............. 156/345 |
| 5,639,519 A | 6/1997 | Patrick et al. ............... 427/569 |
| 5,669,975 A | 9/1997 | Ashtiani ...................... 118/723 |
| 5,710,486 A | 1/1998 | Ye et al. .................... 315/11.21 |
| 5,800,688 A | 9/1998 | Lantsman et al. ...... 204/298.11 |
| 5,830,330 A | 11/1998 | Lantsman ............... 204/192.12 |
| 5,879,523 A | * 3/1999 | Wang et al. ............ 204/298.11 |
| 5,885,358 A | * 3/1999 | Mayden et al. ......... 118/723 R |
| 5,989,838 A | * 11/1999 | Zavada et al. .............. 435/7.23 |
| 6,062,163 A | 5/2000 | Patrick et al. .............. 118/723 |
| 6,080,287 A | 6/2000 | Drewery et al. ........ 204/192.15 |
| 6,089,183 A | * 7/2000 | Imai et al. ................ 118/723 E |
| 6,237,526 B1 | * 5/2001 | Brcka ....................... 118/723 I |
| 6,296,747 B1 | * 10/2001 | Tanaka ................... 204/298.07 |

* cited by examiner

Primary Examiner—Gregory Mills
Assistant Examiner—Rudy Zerrigon
(74) Attorney, Agent, or Firm—Wood, Herron & Evans, LLP (57) ABSTRACT

An apparatus and method for regulating the plasma characteristics in a plasma processing system that includes a plasma generating assembly that generates a primarily inductively-coupled plasma from a process gas in a processing space to process a substrate. A walled enclosure is provided adjacent the processing space and is configured to generate a capacitively-coupled plasma from process gas therein. The enclosure further includes one or more outlets that permit the capacitively-coupled plasma to enter into the processing space. Charged particles from the capacitively-coupled plasma may be applied to alter the plasma density of the inductively-coupled plasma or to reduce the power required to generate the inductively-coupled plasma.

24 Claims, 5 Drawing Sheets

EMBEDDED PLASMA SOURCE FOR PLASMA DENSITY IMPROVEMENT

FIELD OF THE INVENTION

This invention relates to plasma processing of a substrate and, more particularly, to an apparatus and method for improving the plasma density in a plasma processing system.

BACKGROUND OF THE INVENTION

The fabrication of semiconductors, or integrated circuits, typically consists of multiple distinct processing steps, during which numerous replicas of an integrated circuit are formed on a single substrate or wafer. Generally, the fabrication procedure entails the creation of multiple patterned layers on and into the surface of the semiconductor substrate, ultimately forming the electrically active regions, passive elements and interconnects that comprise the integrated circuit.

Modern techniques for fabricating integrated circuits liberally incorporate plasma processes to modify the surface of the semiconductor substrate and to generate the multiple patterned layers. For example, a plasma etching process employs a plasma to selectively remove a layer of extraneous material from the substrate surface or to condition the surface by low-energy ion bombardment. As another example, a physical vapor deposition process may employ a plasma to control the characteristics of the thin films deposited onto the substrate surface from a source of coating material. A high degree of ionization of neutral atoms of coating material has been found to enhance the control over the coating material in transit towards the substrate.

Ionized physical vapor deposition (IPVD) is a plasma-enhanced deposition process used to deposit a thin film or coating onto the surface of the semiconductor substrate. A source of a coating material is positioned within a vacuum chamber usually opposite a substrate support holding the substrate. The source generates a flux of atoms or atomic clusters of coating material, such as by the sputtering of a solid target having the desired elemental composition. To deposit as a thin film upon the substrate, the flux of coating material must traverse a high-density plasma confined within a processing space separating the source and the substrate. The high-density plasma may be generated by coupling radio-frequency (RF) energy to a process gas maintained at an operating pressure in the processing space.

A significant fraction of the flux of coating material is ionized by collisional interactions with the positive ions of process gas (Penning ionization) and free electrons (impact ionization) constituting the high-density plasma. At high density plasma where the electron density exceeds $10^{11}$ $cm^{-3}$, electron impact ionization is the dominant process in IPVD. To preferentially attract positive ions of coating material, the substrate may be negatively biased. The negative bias potential may arise incident to immersion of an ungrounded substrate in the plasma if the substrate support is electrically floating or by directly applying a bias voltage to the substrate support and substrate. The negative bias potential accelerates and steers the trajectories of the positive ions of coating material such that the ions tend to strike the surface of the substrate with a near-normal angle of incidence. As a result, the deposited coating material will more effectively cover the bottoms and sidewalls of submicron features having a high aspect ratio, such as vias, lines, contact holes, and trenches.

The RF energy for generating the high-density plasma is supplied by an RF power supply operably connected to an antenna or excitation coil positioned either external or internal to the vacuum chamber. If the excitation coil is externally positioned, a wall of the vacuum chamber may be further provided with a dielectric window which permits RF energy from the coil to ignite and sustain the plasma and isolates the coil from direct contact with the plasma.

The dielectric window is typically masked by an electrostatic shield, typically formed of an electrically-conductive material and disposed in the vacuum chamber, which functions as a Faraday shield and as a physical shield. A plurality of openings in the shield permit inductive coupling of RF energy emanating from the excitation coil with the plasma while suppressing the unwanted component of parasitic capacitive coupling. As a physical shield, the shield prevents an unwanted conductive layer of coating material from depositing onto the window by concealing the window from the plasma. If an electrically conductive layer of coating material deposits on the window, RF energy from the excitation coil can no longer couple efficiently with the plasma since inductive RF field is absorbed exponentially with the penetration depth in a conductive material. As a result, the plasma density will be reduced and the deposition process deteriorates or the RF power must increased to compensate for the reduced density. If thickness of the unwanted conductive layer exceeds a frequency-dependent threshold, called the skin depth, then significant RF power loss will occur.

A typical coating material source sputters a target, composed of high purity coating material, that is negatively biased with respect to plasma confined close to the target and a chamber anode such as the grounded wall of the vacuum chamber. Usually, the target is operably connected to a direct current power supply that supplies a bias potential for attracting positive ions from the high-density plasma. The source is frequently of a magnetron design which incorporates a magnet structure for creating and confining plasma adjacent the target.

Conventional inductively-coupled plasma processing systems have shortcomings and deficiencies that restrict their widespread application for large-area wafer processing. High-density plasmas generated by inductively coupled plasma generating assemblies exhibit significant radial non-uniformities in plasma density. Due to losses near the chamber walls, the plasma in the processing space has a density distribution that is preferentially peaked about the central symmetry axis of the vacuum chamber and depleted of positive ions near the chamber walls. If such a radially non-uniform plasma is used for etching the surface of a substrate, the removed layer will be thinner near the periphery of the substrate due to reduced ion flux that controls etching rate. In an IPVD apparatus, a radially non-uniform distribution in plasma density may affect the properties of the deposited thin film and coverage of features. For example, the thin film thickness may be uniform due to the target geometry, but step coverage may vary across the wafer diameter due to non-uniformities in the ion distribution. Non-uniformities in etching or deposition are most pronounced for substrates having larger diameters. Since the trend in semiconductor fabrication is toward large-area wafers, the presence of non-uniformities in the plasma density will be more significant in future plasma processing systems, such as IPVD systems and plasma etching systems.

Plasmas generated by inductively coupled plasma generating assemblies exhibit certain limitations regarding the amount of RF power that must be supplied to initiate an inductively-coupled, high-density plasma. Under certain circumstances, the inductively coupled plasma must be extinguished by reducing the RF power. For example, the RF power must be reduced to load or unload substrates from the vacuum chamber or the RF power supply rendered inoperative if the vacuum chamber is vented to atmosphere pressure. To reinitiate the inductively-coupled component of the plasma, a large amount of RF power must be provided by the RF power supply. For example, the power needed to initiate an inductively-coupled high-density plasma may exceed the power needed to initiate a capacitively-coupled plasma by an order of magnitude, under similar chamber conditions.

As a result of the above considerations and problems, there remains a need for an apparatus and method that can supplement the primary, high-density inductively-coupled plasma of an inductively-coupled plasma processing system for increasing plasma uniformity adjacent the substrate and for reducing the RF power required to initiate an inductively-coupled plasma.

SUMMARY OF THE INVENTION

The present invention advantageously provides an apparatus and a method for improving the uniformity of the plasma density in an inductively-coupled plasma processing system. The present invention further advantageously provides an apparatus and a method in which a supplemental capacitively-coupled plasma is provided so that a reduced RF power level is required to initiate a high-density, inductively-coupled plasma in a processing system. Moreover, the present invention advantageously provides a more efficient and effective apparatus and method for plasma processing operations that can be incorporated into current plasma processing systems without significantly altering conventional chamber designs.

According to the principles of the present invention, one or more hollow anode assemblies are located about the interior of the vacuum chamber of a plasma-processing apparatus that relies upon an inductively-coupled, high-density plasma for processing a substrate. Each hollow anode assembly comprises one or more enclosures or discharge cavities which receive a portion of a process gas residing in the vacuum chamber and which are operable for containing a capacitively-coupled plasma therein. Positive ions of process gas and electrons from the capacitively-coupled plasma exit each cavity through one or more outlets provided therein and enter the vacuum chamber.

The vacuum chamber further includes a plasma generating assembly that is configured to deliver energy into the vacuum chamber for generating the inductively-coupled, high-density plasma. An exemplary plasma generating assembly includes an RF power supply operably connected to an excitation coil, which can also provide the energy to initiate and sustain the capacitively-coupled plasma in each cavity.

Enclosures may be positioned, for example, adjacent to the plasma generating assembly or adjacent to a substrate support. However, in positions with the vacuum chamber remote from the plasma generating assembly, the coupled energy may be insufficient to generate the capacitively-coupled plasma within each cavity or the excitation coil would require modifications which would add complexity to the processing system. In these cases, the plasma generating assembly may further incorporate an ancillary power supply operable to generate the capacitively-coupled plasma. In one aspect, an electrode may be positioned within the cavity of each enclosure and operably connected to the ancillary power supply.

According to the apparatus and method of the present invention, one advantage is that a capacitively coupled plasma can be initiated and sustained in the cavity of each enclosure without the need for an additional plasma generating assembly. Power from the plasma generating assembly, which is principally operable for inductively coupling with process gas in the processing space, can capacitively couple with process gas to generate a plasma in each enclosure. It follows that the enclosure, in certain embodiments, can be a passive element of the plasma processing system without requiring an electrode, an additional power supply, or an electrical feedthrough.

Another advantage of the apparatus and method of the present invention is that the density distribution of the inductively coupled plasma in the processing space can be efficaciously modified by emitting ions and electrons from each enclosure and, as a result, the plasma process will achieve results having improved uniformity.

Yet another advantage of the apparatus and method of the present invention is that the power required to initiate an inductively coupled plasma in the processing space can be significantly reduced by providing electrons and ions from the capacitively coupled plasma generated within each enclosure prior to ignition of an inductively-coupled plasma in the processing space.

The present invention may be incorporated into an existing processing chamber merely by modifying the shield structure to add one or more enclosures. Therefore, the addition of one or more of the enclosures will not significantly alter design of the processing chamber, while optimizing plasma processing and overcoming the difficulties set forth in the background above.

These and other advantages of the present invention will be more readily apparent from the following detailed description of the drawings.

DETAILED DESCRIPTION OF THE INVENTION

Figure 1:
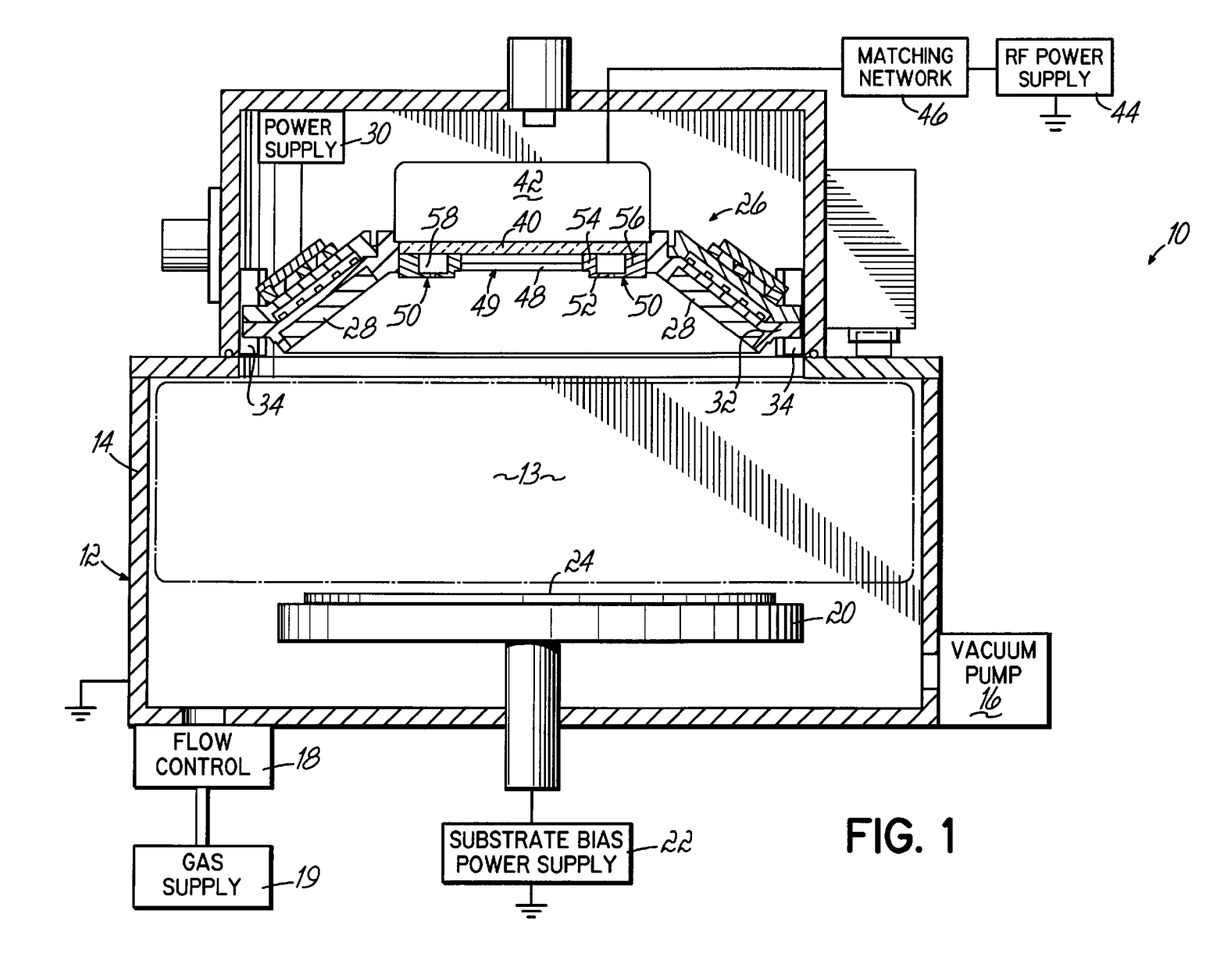
FIG. 1 is a cross-sectional diagrammatic representation of a plasma-processing apparatus incorporating a hollow anode assembly in accordance with principles of the present invention.

A plasma-processing apparatus 10, according to one embodiment of the present invention, configured for ionized physical vapor deposition (IPVD) is diagrammatically represented in FIG. 1. The apparatus 10 includes a vacuum chamber 12 having a processing space 13 bounded by a chamber wall 14. Chamber 12 is provided with a vacuum pumping system 16 for evacuation of the chamber 12 to an ultra-high vacuum (UHV) level of about $10^{-8}$ torr or less. A mass flow control device 18 controls the flow rate of a process gas from a gas supply 19 into chamber 12. Suitable process gases include inert gases, such as argon, or reactive gases, such as nitrogen or oxygen. A manual or automated vacuum loadlock (not shown) may be provided to transfer substrates into and out of chamber 12 while maintaining a suitable vacuum within the chamber 12 and the loadlock.

At one end of the vacuum chamber 12 is situated a substrate support 20 to which a substrate bias power supply 22 is operably connected applying a negative bias on the substrate support 20 and to one or more substrates 24, such as semiconductor wafers, supported thereon for plasma processing. Bias power supply 22 may comprise a direct current bias supply or an RF bias supply connected through an impedance matching network.

At the opposite end of the chamber 12 from the substrate support 20 is situated a coating material source or cathode assembly 26. The cathode assembly 26 includes a ring-shaped target 28 of the desired coating material and is operably connected to a bias potential furnished by a cathode power supply 30. The power supply 30 is preferably a DC power supply, but may be an RF supply operably connected to the target 28 through a suitable matching network (not shown). The cathode assembly 26 is electrically isolated from electrically grounded surfaces of the chamber 12 by an insulator ring 34. The chamber wall 14, which is usually at ground potential, may serve as an anode. Dark space shield 32 prevents the plasma from eroding or sputtering structure adjacent the target.

A non-conductive window 40 is concentrically provided within the central opening of cathode assembly 26 and is configured so as to create a circumferential vacuum-tight seal with an upper edge of the target 28. The window 40 is constructed of a vacuum-compatible dielectric material, such as alumina or quartz, preferably alumina, and is a generally planar structure having substantially parallel, opposed planar surfaces or faces.

An excitation coil, shown schematically as element 42, is positioned adjacent the outer face of non-conductive window 40, preferably in close proximity to the window 40. Coil 42 is operably connected through an impedance matching network 46 to an RF power supply 44. The RF power supply 44 may be operative in the range of from about 200 kHz to about 80 MHZ and may deliver an RF power between about 100 W and about 10 kW. Since window 40 is electrically non-conductive, RF magnetic energy emanating from coil 42 will not be attenuated during its passage through window 40 into processing space 13.

Suitable excitation coils 42 can be adapted from antennas, for example, as described in U.S. Pat. No. 4,948,458 issued to Ogle, U.S. Pat. No. 5,669,975 issued to Ashtiani, and U.S. patent application Ser. No. 09/277,526 in the name of Josef Brcka entitled Process Apparatus and Method for Improving Plasma Distribution and Performance in an Inductively Coupled Plasma, filed on Mar. 26, 1999. The disclosure of each is hereby expressly incorporated by reference herein in its entirety.

Adjacent the inner face of the non-conductive window 40 is a shield 48, which serves as a combination Faraday shield and physical shield. The shield 48 is mounted a small distance from inner face of the window 40. As a Faraday shield, the shield 48 promotes inductive coupling of energy from excitation coil 42, across window 40, and into the processing space 13 while reducing undesired capacitive coupling between coil 42 and the high-density plasma. As a physical shield, the shield 48 prevents coating material from depositing onto the window 40 by blocking substantially all direct line-of-sight paths between any point on the surface of the target 28 and the window 40. Shield 48 is preferably composed of a material having a high electrical conductivity, such as copper or aluminum.

Shield 48 includes a plurality of slots 49 and may be electrically grounded to, and maintained in good thermal contact for conductive heat flow with, adjacent structures within vacuum chamber 12, such as chamber wall 14. The plurality and geometry of slots 49 is configured to avert eddy currents in the shield 48 and allow RF magnetic fields to penetrate shield 48.

In operation, the vacuum chamber 12 is evacuated to a base vacuum level by vacuum pumping system 16. A flow of a process gas is introduced from gas supply 19 to the chamber 12. Flow control device 18 meters the gas flow to establish a flow rate of about 5 to about 1000 standard cubic centimeters per minute (sccm) and an operating pressure between about 1 to about 100 mtorr. Power supply 44 is energized to supply RF power through matching network 46 to the excitation coil 42. A high density primary plasma is initiated and thereafter sustained in the processing space 13 by inductively-coupled RF energy transmitted from coil 42 through non-conductive window 40 and shield 48. A negative bias potential is supplied by cathode power supply 30 for accelerating positive ions from the processing space toward the target 28 to impact with sufficiently high energy to sputter atoms or atomic clusters of coating material therefrom. Transport of the sputtered coating material is diffusion driven when thermalized and the material flux must pass through the high-density plasma to reach the substrate 24. A portion of the atoms or atomic clusters become ionized due to collisional interactions with ions and electrons in the high-density plasma. The negative bias applied to substrate 24 by the substrate bias power supply 22 electrostatically attracts and steers positive ions of coating material from the plasma towards the substrate 24 with ion trajectories predominately parallel to the surface normal thereof.

Figure 2A:
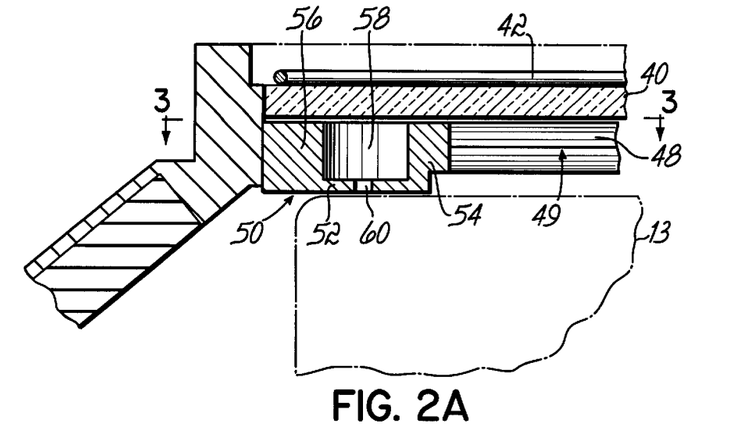
FIG. 2A is an enlarged, fragmentary cross-sectional view illustrating an embodiment of the hollow anode assembly of FIG. 1.
Figure 3:
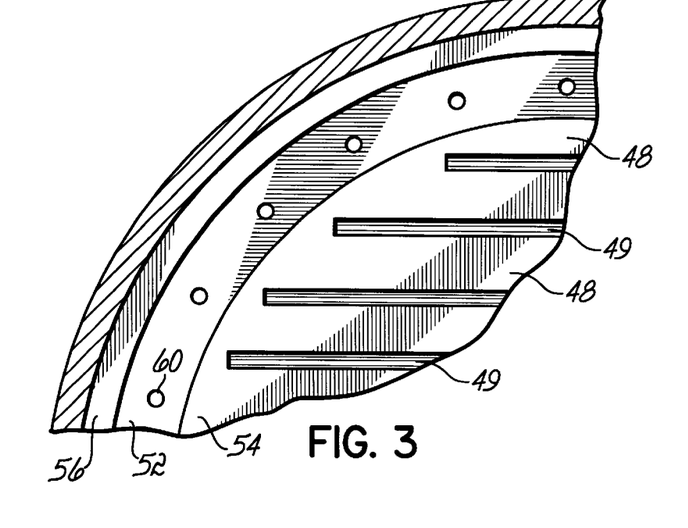
FIG. 3 is a plan view of the section of shield and hollow anode assembly taken along line 3—3 of FIG. 2A.

In accordance with the principles of the present invention, the periphery of the shield 48 further includes a hollow anode assembly 50, which is operable to supply positive ions of process gas and electrons from a capacitively-coupled plasma generated therein. Referring to FIGS. 1, 2A and 3, the hollow anode assembly 50 comprises an end wall 52 and two opposed, generally parallel side walls 54, 56 that collectively define the boundaries of an annular enclosure or discharge cavity 58. Cavity 58 extends about an outer circumference of, and is substantially concentric with, the shield 48. Walls 52, 54, and 56 are preferably composed of a material that has a low electrical resistivity, such as copper or aluminum, and may have the same composition as shield 48.

Continuing to refer to FIGS. 1, 2A and 3, hollow anode assembly 50 further includes an array of cylindrical outlets or openings 60 that perforate the end wall 52 at substantially equal circumferential spacings. The longitudinal axis of each opening 60 is oriented generally parallel to the longitudinal axis of the chamber 12. A portion of the process gas in processing space 13 can freely diffuse into discharge cavity 58 through each opening 60. Hollow anode assembly 50 is not electromagnetically shielded by shield 48 and, therefore, RF energy may be capacitively-coupled from excitation coil 42 across dielectric window 40 so as to generate a capacitively-coupled plasma in the cavity 58. If the RF power exceeds a predetermined initial threshold, a capacitively-coupled plasma will be initiated in cavity 58 and will be subsequently sustained by capacitive coupling of RF energy.

Positive ions and electrons from the capacitively-coupled plasma in discharge cavity 58 spread through each opening 60 into the processing space 13. Because of a well-known physical phenomenon known in the art of plasma technology, the plasma within the opening 60 has a significantly greater density than the plasma in either cavity 58 or the portion of the processing space 13 adjacent opening 60. Electrons are accelerated from the capacitively-coupled plasma within cavity 58 toward the portion of the capacitively-coupled plasma within opening 60 and produce enhanced ionization of process gas atoms for enhancing the plasma density within opening 60. Positive ions of process gas and electrons accelerate out of the opening 60 having initial trajectories generally directed axially toward the base of the vacuum chamber 12.

An advantage of configuring the hollow anode assembly 50 with axially-oriented openings 60 is that the capacitively-coupled plasma produced in cavity 58, and separated from processing space 13, can be employed to sustain a low-density plasma in processing space 13 when the RF power from the excitation coil 42 is reduced below a threshold for sustaining an inductively-coupled plasma therein. The RF power to coil 42 must be reduced and the inductively-coupled plasma in processing space 13 can no longer be sustained during, for example, a substrate exchange operation.

By way of example, and not by way of limitation, the hollow anode cavity may be sized such that the radial dimension of discharge cavity 58 is about 10 to 30 mm, preferably about 10 mm, and the axial dimension is about 20 mm. The diameter of each opening 60 may be about 1 mm to 10 mm, depending upon the dimensions of discharge cavity 58 and the thickness of end wall 52. The cross-sectional shape of the hollow anode aperture is not limited to being circular, but may also be rectangular or other geometrical shapes.

Figure 2B:
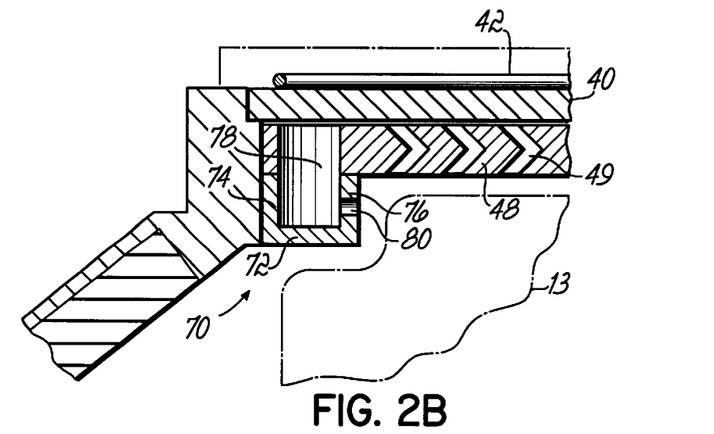
FIG. 2B is an enlarged, fragmentary cross-sectional view, similar to FIG. 2A, illustrating an alternative embodiment of the hollow anode assembly of FIG. 1.

In accordance with the principles of the present invention and using like reference numbers for features discussed with reference to FIGS. 1 and 2A, FIG. 2B illustrates an alternative embodiment of the hollow anode assembly 70 that is likewise positioned about the circumference of the shield 48. Hollow anode assembly 70 has an end wall 72 and two side walls 74, 76 that define an annular enclosure or a discharge cavity 78. One or more cylindrical outlets or openings 80 are provided is side wall 76. The longitudinal axis of each opening 80 is oriented radially inwardly toward the longitudinal axis of vacuum chamber 12 (FIG. 1) and has a generally circular cross-sectional profile. As explained above with regard to hollow anode assembly 50 shown in FIGS. 1, 2A, and 3, a capacitively-coupled plasma is generated from process gas received in cavity 78. Electrons from the capacitively-coupled plasma in cavity 78 are accelerated into each opening 80 for enhancing the density of the portion of the capacitively-coupled plasma therein. Positive ions and electrons expand from the dense plasma in opening 80 into the processing space 13 (FIG. 1). Due to the radial orientation of openings 80, the initial trajectories of the positive ions are generally directed radially inward toward the longitudinal axis of the vacuum chamber 12 and adjacent the inner face of the shield 48.

An advantage of configuring the hollow anode assembly 70 with radially-facing openings 80 is that ions and electrons from the capacitively-coupled plasma can be employed to establish a low-density plasma in processing space 13 before attempting to initiate an inductively-coupled, high-density plasma therein. The presence of the low-density plasma established near the periphery of the shield 48 will reduce the power level required to initiate the inductively-coupled plasma.

A plasma presents a non-linear load to the RF power supply 44 (FIG. 1) and a large initial RF power level is required to initiate an inductively-coupled plasma in processing space 13. A plasma typically cannot be easily initiated by inductive coupling between the excitation coil 42 and the process gas in processing space 13 for the low millitorr operating range of apparatus 10. The threshold RF power required to initiate an inductively-coupled plasma varies depending upon the vacuum in chamber 12 but has been measured, for example, to range from 250 to 500 watts for a typical plasma-processing system under typical operating conditions. By contrast, the threshold power required to initiate a capacitively-coupled plasma under similar conditions is only on the order of 50 to 100 watts. Therefore, a capacitively-coupled plasma may be initiated in process space 13 at a greatly reduced RF power level.

The presence of the shield 48, however, effectively prevents the capacitively-coupling of energy between the excitation coil 42 and the process gas into processing space 13. Hollow anode assembly 50 or 70 provides an unshielded discharge cavity 58 or 78, respectively, in which a capacitively-coupled plasma can be initiated and sustained at a reduced RF power level. Positive ions of process gas and electrons exiting from the capacitively-coupled plasma within opening 60 or 80 in hollow anode assembly 50 or 70, respectively, will contribute to establishing a low density plasma in processing space 13 and, thereby, reduce the RF power level required to initiate an inductively-coupled plasma therein.

Figures 4, 4A:
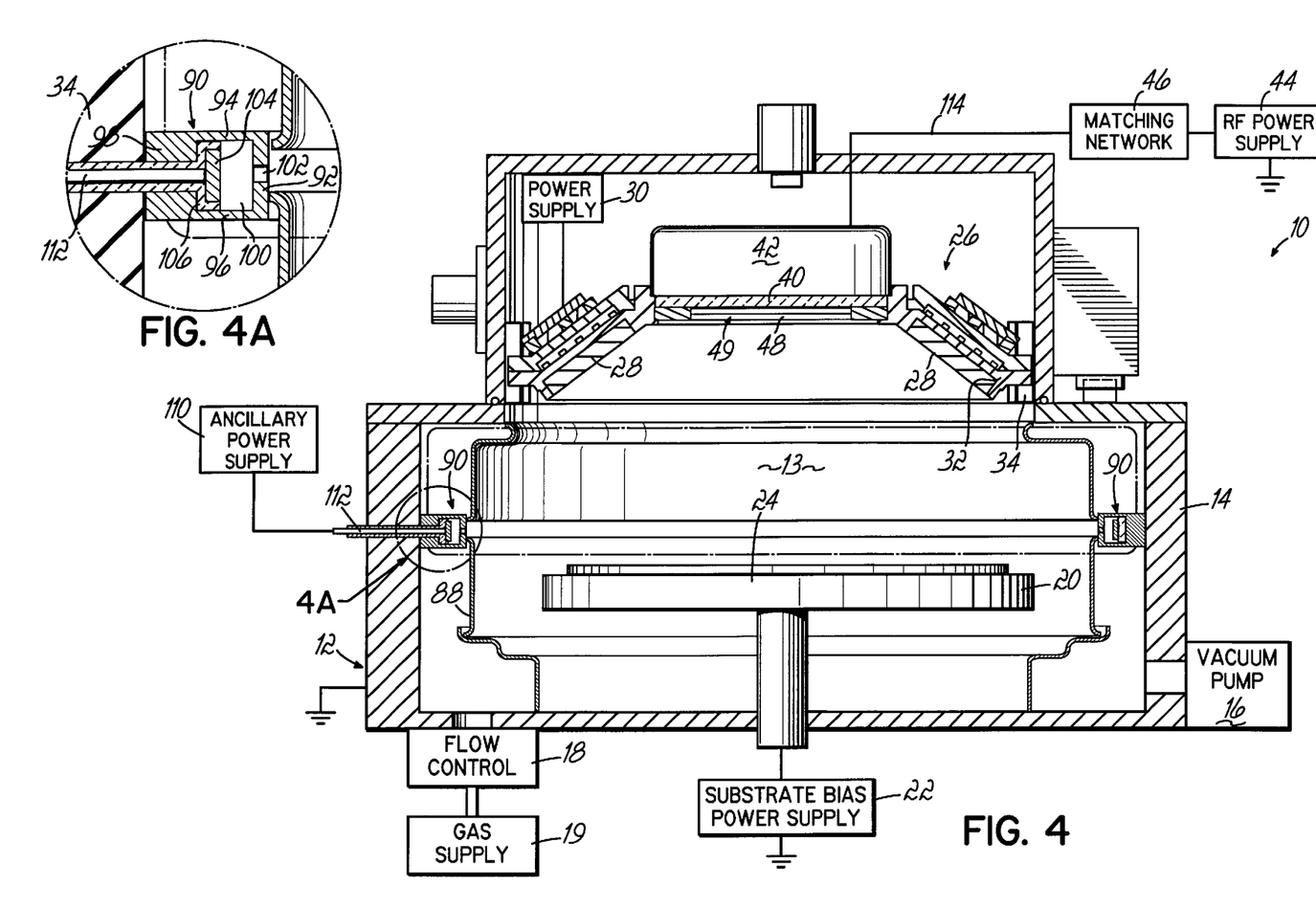
FIG. 4 is cross-sectional diagrammatic representation, similar to FIG. 1, of a plasma-processing apparatus incorporating an alternative embodiment of a hollow anode assembly in accordance with principles of the present invention.
FIG. 4A is an enlarged view of encircled area "4A" of FIG. 4.

FIGS. 4 and 4A diagrammatically represent an alternative embodiment of the plasma processing apparatus 10, in accordance with the principles of the present invention. Referring to FIGS. 4 and 4A and using like reference numerals for features discussed with reference to other Figures, the plasma processing system 10 further includes a sputter shield 88 circumferentially and coaxially disposed about the interior of the vacuum chamber 12 and a hollow anode assembly 90 attached to chamber wall 14. Sputter shield 88 is a renewable metallic barrier that prevents ions of the inductively-coupled, high-density plasma in processing space 13 from interacting with the interior surfaces of chamber wall 14.

Hollow anode assembly 90 has an end wall 92, two side walls 94, 96, and a base 98 that collectively bound an annular enclosure or a discharge cavity 100. Discharge cavity 100 extends circumferentially about the interior of the vacuum chamber 12. Relative to the longitudinal axis of chamber 12, hollow anode assembly 90 is axially positioned adjacent the substrate support 22 and substrate 24. However, the hollow anode assembly 90 may be located at alternative positions for modifying the plasma density in other volumes of processing space 13.

One or more cylindrical outlets or openings 102 are provided in the end wall 92. The longitudinal axis of each opening 102 is oriented radially inward toward the longitudinal axis of the chamber 12. A portion of the process gas introduced into the processing space 13 can freely diffuse through each opening 102 into discharge cavity 100.

An electrode 104 is provided within discharge cavity 100. Electrode 104 is composed of an electrically-conductive material, such as aluminum or copper, and has an axial dimension that is generally coextensive with the axial dimension of cavity 100. A non-conductive standoff 116 is interposed between a radially outermost surface of the electrode 104 and an inner surface of the base 98. Standoff 116 is composed of a suitable dielectric material having a high electrical resistivity, such as alumina, for electrically isolating electrode 104 from the grounded base 98.

Ancillary power supply 110 is operably connected to the electrode 104 via an electrical feedthrough 112, which is provided in chamber wall 14 and base 98. The ancillary power supply 110 may constitute a power divider (not shown) that divides the RF power input from the RF power supply 44 to energize the electrode 104 via a transmission line (not shown) and, as discussed above, to energize excitation coil 42 via transmission line 114. The power supplied to electrode 104 capacitively couples with process gas in the discharge cavity 100 for generating a capacitively-coupled plasma therein.

In an alternative embodiment, the ancillary power supply 110 may be completely independent of RF power supply 44 and comprise a separate power supply (not shown) operably connected to electrode 104. Either a direct current power supply or an independent radio-frequency (RF) power supply are suitable for use as an ancillary power supply 110.

In operation, electrode 104 is energized by ancillary power supply 110 with a power level sufficient to ignite a capacitively-coupled plasma in discharge cavity 100. Electrons are attracted from the capacitively-coupled plasma in cavity 100 towards each opening 102, thus enhancing the plasma density within opening 102. Electrons and positive ions expand from opening 102 into processing space 13. Initial trajectories of positive ions and electrons exiting each opening 102 are generally directed radially inward toward the longitudinal axis of the vacuum chamber 12 and act to enhance the density of the high-density plasma in processing space 13 at a position adjacent the periphery of the substrate 24.

An advantage of locating hollow anode assembly 70 adjacent the substrate support 22 is that positive ions and electrons from the capacitively-coupled plasma streaming through the opening into the processing space 13 can increase the plasma density near the periphery of the substrate 24. The uniformity of the plasma density in processing space 13 is affected by the geometry of the vacuum chamber 12 such that the density is peaked about the longitudinal axis of chamber 12 and reduced near the chamber wall 14. In particular, the proximity of the chamber wall 14 to the substrate support 22 adversely affects the radial uniformity of the plasma density near the substrate 24. The reduction in plasma density is greatest at the periphery of the substrate 24 which lies closest to the wall. Thus, positive ions and electrons from the hollow anode assembly 70 may advantageously compensate for the non-uniform plasma density, so that a thin film of coating material will be deposited on substrate 24 having a more uniform thickness and a more uniform step coverage radially across the surface thereof. Further, a sputtering or surface conditioning operation will be more radially uniform across the surface of substrate 24 due to the enhanced plasma uniformity.

Figure 5:
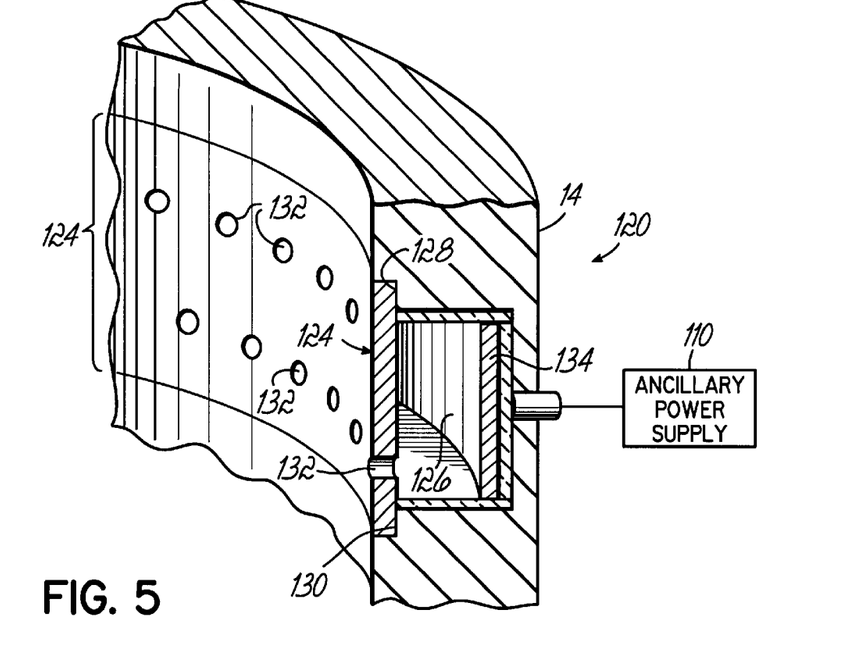
FIG. 5 is an fragmentary cross-sectional view illustrating an alternative embodiment of a hollow anode assembly similar to that shown in FIG. 4.

Referring to FIG. 5, in an alternative embodiment of the present invention, hollow anode assembly 120 includes a face plate 124 and a cavity 126 that is integrally provided or embedded within chamber wall 14. Face plate 124 is received by recessed ledges 128, 130 adjacent the radially inward periphery of cavity 126. Face plate 124 is perforated by an array of gas outlets or cylindrical openings 132, which are spaced about the circumference and width of the face plate 124 so as to provide a symmetrical injection of positive ions and electrons. Hollow anode assembly 120 is primarily intended for application in a vacuum chamber 12, as in FIG. 1, that lacks a sputter shield 88 depicted in FIG. 4. It may be appreciated that the shape of openings 132 is not limited to being circular, but can be rectangles or other shapes, such as slots.

An electrode 134 is provided within discharge cavity 126 for receiving excitation power from the ancillary power supply 110 so as to generate a capacitively-coupled plasma from the process gas. Electrode 134 is composed of an electrically-conductive material, such as aluminum or copper, and has an axial dimension that is generally coextensive with the axial dimension of discharge cavity 126. A non-conductive standoff 136 is interposed between electrode 134 and the chamber wall 14. The standoff 136 is composed of a suitable dielectric material having a high electrical resistivity, such as alumina, for electrically isolating electrode 134 from the chamber wall 14. Chamber wall 14 and face plate 124 are electrically grounded so as to form a second electrode. When a capacitively-coupled plasma is initiated in cavity 126 by energizing electrode 134 with power from the ancillary power supply 110, electrons from the capacitively-coupled plasma are attracted into each opening 132. As a result, the plasma density is enhanced in openings 132 and positive ions and electrons from that dense plasma spread out into processing space 13.

Figure 5A:
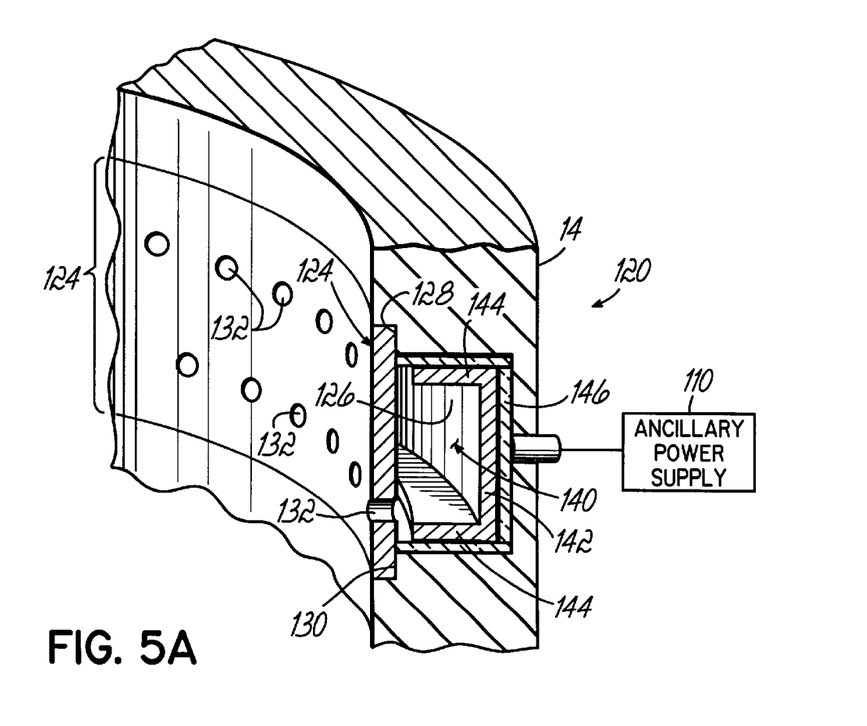
FIG. 5A is an enlarged, fragmentary cross-sectional view, similar to FIG. 5, illustrating an alternative embodiment of the hollow anode assembly.

Referring to FIG. 5A and using like reference numerals for features discussed with reference to FIG. 5, hollow anode assembly 120 may alternatively include an electrode 140 positioned in discharge cavity 126 and operably connected with ancillary power supply 110. Electrode 140 has a U-shaped cross-sectional profile and that extends about the circumference of cavity 126. Electrode 140 includes a base 142 that is oriented generally parallel to the longitudinal axis of the vacuum chamber 12. Two integral side walls 144, 146 extend from opposed ends of the base 142 radially inwardly toward the central longitudinal axis of the vacuum chamber 12, shown in FIG. 4. Electrode 140 is composed of an electrically-conductive material, such as aluminum or copper. A non-conductive, U-shaped standoff 146 is interposed between electrode 140 and the chamber wall 14. The standoff 146 is composed of a suitable dielectric material having a high resistivity, such as alumina, for electrically isolating electrode 140 from the chamber wall 14.

This U-shaped design of electrode 140 better tolerates the deposition of metal ions arriving from the high-density plasma through openings 132, compared to the electrode 134 depicted in FIG. 5. The U-shape of electrode 140 also advantageously focuses electrons into the center of cavity 126, where openings 132 are located, thereby increasing the efficiency of the process gas ionization therein.

Figure 5B:
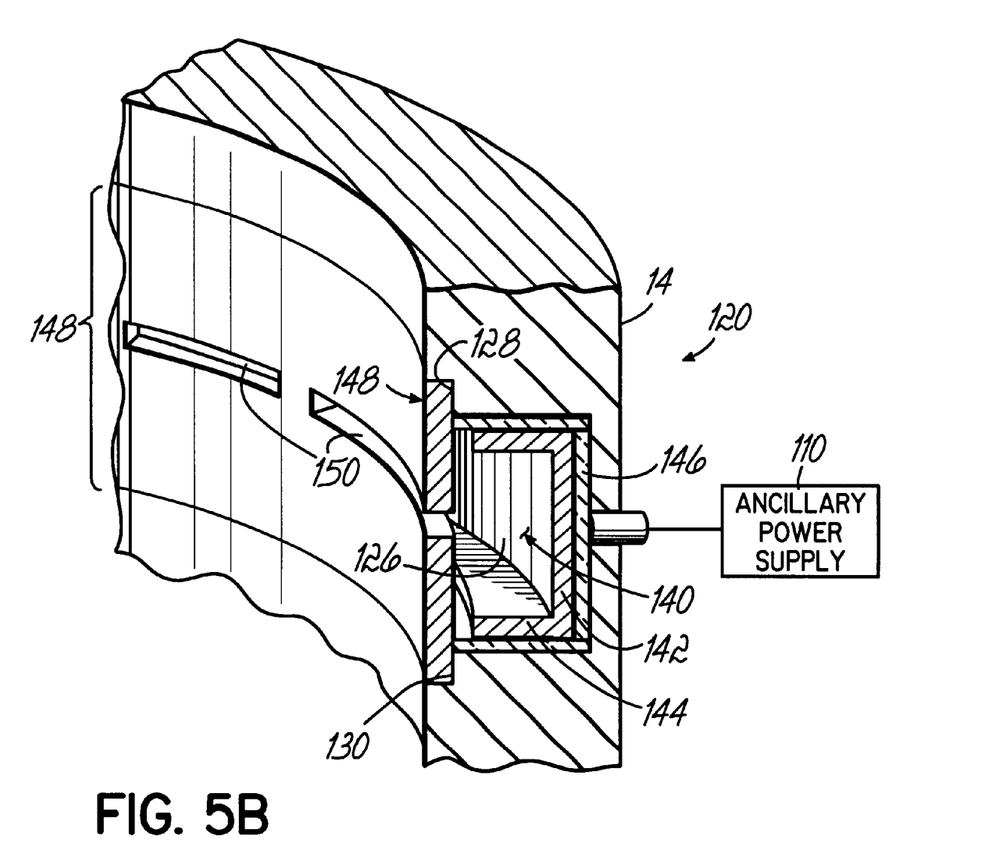
FIG. 5B is an enlarged, fragmentary cross-sectional view, similar to FIG. 5A, illustrating an alternative embodiment of the hollow anode assembly.

Referring to FIG. 5B and using the reference numerals for features discussed with reference to FIG. 5A, another embodiment of hollow anode assembly 120 includes a face plate 148 extending about a plurality of equally-spaced slots 150 that connects discharge cavity 126 for fluid communication with processing space 13 (FIG. 3). Slots 150 extend about the circumference of plate 148, which is received on recessed ledges 128, 130. When a capacitively-coupled plasma is generated in cavity 126 and slots 150, electrons and positive ions from the plasma within slots 150 are injected into process space 13.

It may be appreciated that electrode 104, 134 or 140 may be partitioned into multiple segments that are each provided with excitation power from an ancillary power supply 110. Each segment may be powered by a separate ancillary power supply or by power divided from a single ancillary power supply. Further, one of ordinary skill in the art of plasma processing would understand that the cavities 100 and 126 may be partitioned into a plurality of individual subcavities, wherein one or more of the subcavities are provided with a distinct electrode, such as electrode 104, 134 or 140, energized by an associated ancillary power supply 110.

If the ancillary power supply 110 is decoupled from RF power supply 44, hollow anode assembly 90 or 120 is suitable for use in those plasma processing systems where the high-density plasma in processing space 13 is not generated by inductive coupling of RF power from coil 42. For example, the high-density plasma may be generated in processing space 13 by either a microwave source or an independent RF power source operably connected to a pair of plate electrodes, as in conventional planar electrode or reactive ion etching systems.

While the present invention has been illustrated by the description of several embodiment thereof, and while those embodiments have been described in considerable detail, it is not intended to restrict or in any way limit the scope of the appended claims to such detail. Additional advantages and modifications will readily appear to those skilled in the art. The invention in its broader aspects is therefore not limited to the specific details, and representative apparatus and method shown and described. For example, while the explanation of the application of the hollow anode assembly of the present invention is given with respect to an inductively-coupled plasma vapor deposition system, use of the hollow anode assembly is not so limited, and may be used in other materials processing applications as known in the art, such as plasma etching or reactive ion etching. Accordingly, departures may be made from such details without departing from the scope or spirit of applicant's general inventive concept.

What is claimed is:

1. An apparatus for processing a substrate with a plasma, the apparatus comprising:
    a vacuum chamber having a chamber wall defining a processing space therein and having a central longitudinal axis;
    a substrate support disposed in the processing space for supporting a substrate;
    a process gas supply in fluid communication with the vacuum chamber, said gas supply for selectively providing a process gas into said processing space;
    a plasma generating assembly operable for exciting the process gas in the processing space to generate a plasma; and
    an enclosure disposed within said vacuum chamber, wherein said enclosure is configured to define at least one cavity operable for containing a portion of the plasma which is sustained by capacitively-coupled energy from the plasma generating assembly, and the enclosure including at least one outlet configured for fluid communication with said processing space, so that the capacitively-coupled plasma within each cavity and each outlet can enter into the processing space.

2. The apparatus of claim 1, wherein the enclosure is positioned adjacent said plasma generating assembly.

3. The apparatus of claim 2, wherein the at least one outlet is oriented radially inward toward the central longitudinal axis of the vacuum chamber.

4. The apparatus of claim 2, wherein the at least one outlet is oriented parallel to the central longitudinal axis of the vacuum chamber.

5. The apparatus of claim 1, wherein the at least one enclosure is positioned adjacent said substrate support.

6. The apparatus of claim 1, wherein the at least one enclosure is positioned about the interior of the vacuum chamber.

7. The apparatus of claim 1, further wherein said plasma generating assembly further comprises an ancillary plasma generating assembly configured to excite the process gas in each cavity of the enclosure.

8. The apparatus of claim 7, wherein said ancillary plasma generating assembly comprises an electrode positioned within each cavity of the enclosure and an ancillary power supply operably connected to said electrode for exciting the process gas to generate a capacitively-coupled plasma in the cavity.

9. The apparatus of claim 8, wherein said ancillary power supply comprises an ancillary radio frequency power supply operably connected to said electrode.

10. The apparatus of claim 8, wherein said ancillary power supply comprises a direct current power supply operably connected to said electrode.

11. The apparatus of claim 8, wherein said ancillary power supply comprises an impedance-matching power splitter that redirects a portion of the radio frequency power from the plasma generating assembly, said power splitter operably connected to said electrode.

12. The apparatus of claim 8, wherein said electrode has a U-shaped cross-sectional profile.

13. The apparatus of claim 1, wherein the plasma generating assembly comprises:
    a radio frequency power supply; and
    an excitation coil operably connected to the radio frequency power supply and disposed adjacent the vacuum chamber so as to excite the process gas to generate an inductively coupled plasma in the processing space.

14. The apparatus of claim 13, further comprising a dielectric window disposed in said chamber wall and wherein said excitation coil is positioned adjacent said dielectric window.

15. The apparatus of claim 14, further comprising a shield inside of the vacuum chamber between the dielectric window and the processing space, the shield being configured to permit the effective coupling of radio frequency power from the excitation coil into the processing space.

16. The apparatus of claim 15, wherein the at least one enclosure is attached to said shield.

17. The apparatus of claim 16, further comprising a source of a coating material including a target composed of the coating material and a cathode assembly configured to confine a portion of the plasma within the processing space adjacent the target so as to sputter coating material from said target and wherein said shield is further configured to physically shield the dielectric window from the plasma present in the processing space.

18. The apparatus of claim 17, wherein the at least one outlet is oriented radially inward toward the central longitudinal axis of the vacuum chamber.

19. The apparatus of claim 17, wherein the at least one outlet is oriented parallel to the central longitudinal axis of the vacuum chamber.

20. An ionized physical vapor deposition apparatus comprising:

a vacuum chamber having a chamber wall defining a processing space therein;

a substrate support disposed in the processing space for supporting a substrate;

a process gas supply in fluid communication with the vacuum chamber, said gas supply for selectively providing a process gas into said processing space;

a source of a coating material positioned in the processing space opposite the substrate support;

a dielectric window disposed in said chamber wall;

an excitation coil positioned adjacent the dielectric window;

a radio frequency power supply operably connected to the excitation coil so as to inductively couple radio frequency power into the vacuum chamber for forming an inductively coupled plasma in the processing space when the radio frequency power supply is energized; and an enclosure disposed within said vacuum chamber, wherein said enclosure is configured to define at least one cavity operable for containing a portion of the plasma which is sustained by capacitively-coupled energy from the excitation coil, and the enclosure includes at least one outlet configured for fluid communication with said processing space, so that the capacitively-coupled plasma in each cavity and each outlet can enter into said processing space.

21. The ionized physical vapor deposition apparatus of claim 20, further comprising a shield inside of the vacuum chamber between the dielectric window and the processing space, the shield being configured to permit the effective coupling of radio frequency power from the excitation coil into the processing space and to physically shield the dielectric window from interacting with plasma in the processing space.

22. The ionized physical vapor deposition apparatus of claim 21, wherein the enclosure is attached to said shield.

23. The ionized physical vapor deposition apparatus of claim 21, wherein the source of the coating material comprises a target composed of the coating material and a cathode assembly configured to confine a portion of the plasma within processing space adjacent the target so as to sputter the coating material from the target.

24. An apparatus for processing a substrate with a plasma, the apparatus comprising:

a vacuum chamber having a processing space, said processing space filled with a process gas;

means for exciting the process gas to generate a plasma, said plasma exciting means selectively operable to sustain an inductively-coupled plasma in the processing space of the vacuum chamber; and an enclosure disposed within the vacuum chamber, wherein said enclosure is configured to define at least one cavity operable for containing a portion of the plasma generated by capacitively-coupled energy from the plasma exciting means, and the enclosure including at least one outlet configured for fluid communication with said processing space, so that the capacitively-coupled plasma within each cavity and each outlet can enter the processing space.

* * * * *